US012563833B2

(12) United States Patent
Wang et al.

(10) Patent No.: US 12,563,833 B2
(45) Date of Patent: Feb. 24, 2026

(54) DISPLAY DEVICE

(71) Applicant: Samsung Display Co., LTD., Yongin-si (KR)

(72) Inventors: Jeong Kook Wang, Hwaseong-si (KR); Ki Nyeng Kang, Sejong-si (KR); Veidhes Basrur, Yongin-si (KR); Ock Soo Son, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 527 days.

(21) Appl. No.: 18/095,693

(22) Filed: Jan. 11, 2023

(65) Prior Publication Data

US 2023/0317735 A1     Oct. 5, 2023

(30) Foreign Application Priority Data

Apr. 1, 2022     (KR) ......................... 10-2022-0041108

(51) Int. Cl.
  *H10D 86/40*          (2025.01)
  *H01L 25/16*          (2023.01)
(52) U.S. Cl.
  CPC ......... *H10D 86/441* (2025.01); *H01L 25/167* (2013.01)

(58) Field of Classification Search
  CPC ... H10D 86/441; H01L 25/167; H10K 59/131
  See application file for complete search history.

(56) References Cited

U.S. PATENT DOCUMENTS

2022/0102469 A1*   3/2022   Arakawa ............. H10K 59/131

FOREIGN PATENT DOCUMENTS

WO        2022265343        12/2022

* cited by examiner

*Primary Examiner* — Peter M Albrecht
(74) *Attorney, Agent, or Firm* — Womble Bond Dickinson (US) LLP

(57)          ABSTRACT
A display device comprises a first substrate portion including a display area and a non-display area positioned near the display area, and including a pad area, and a second substrate portion facing the first substrate portion. The first substrate portion further includes an overlap area overlapping the second substrate portion in a plan view, and a protrusion area that protrudes more than a side of the second substrate portion, a first sub-substrate portion, a first conductive layer including an alignment pad disposed in the pad area on the protrusion area of the first sub-substrate portion, and a second conductive layer including a first alignment signal line electrically connected to the alignment pad on the first conductive layer, the protrusion area includes an open portion, and the first alignment signal line in a plan view is physically separated based on the open portion.

20 Claims, 14 Drawing Sheets

ASL: ASLL1, ASLL2
ASLL1: ASLL11, ASLL12
ASLL2: ASLL21, ASLL22

DR3

EL: AE, ED, CE

PX: SPX1, SPX2, SPX3

ASL: ASLL1, ASLL2
ASLL1: ASLL11, ASLL12
ASLL2: ASLL21, ASLL22

DISPLAY DEVICE

CROSS-REFERENCE TO RELATED APPLICATION

This application claims priority to and benefits of Korean Patent Application No. 10-2022-0041108 under 35 U.S.C. § 119, filed in the Korean Intellectual Property Office on Apr. 1, 2022, and the entire contents of which are incorporated herein by reference.

BACKGROUND

1. Technical Field

The disclosure relates to a display device capable of preventing moisture permeation.

2. Description of the Related Art

The importance of display devices as communication media, has been emphasized because of the increasing developments of information technology. Also, various types of display devices such as an organic light emitting display (OLED) device and a liquid crystal display (LCD) device have been used.

Among the display devices for displaying an image, light emitting display devices include light emitting elements, which emit light independently. The light emitting display devices include an organic light emitting display device that uses an organic material as a light emitting material, an inorganic light emitting display device that uses an inorganic material as a light emitting material, or the like.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device capable of preventing moisture permeation.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure, a display device comprises a first substrate portion including a display area and a non-display area positioned near the display area, and including a pad area, and a second substrate portion facing the first substrate portion. The first substrate portion further includes an overlap area overlapping the second substrate portion in a plan view, and a protrusion area that protrudes more than a side of the second substrate portion, a first sub-substrate portion, a first conductive layer including an alignment pad disposed in the pad area on the protrusion area of the first sub-substrate portion, and a second conductive layer including a first alignment signal line electrically connected to the alignment pad on the first conductive layer, the protrusion area includes an open portion, and the first alignment signal line in a plan view is physically separated based on the open portion.

The first substrate portion may further include a semiconductor layer disposed between the first sub-substrate portion and the first conductive layer and disposed in the display area.

The first substrate portion may further include a gate insulating layer between the semiconductor layer and the first conductive layer, and a gate electrode included in the first conductive layer of the first substrate portion and overlapping the semiconductor layer in a plan view.

The first alignment signal line in a plan view may include a (1-1)th alignment signal line and a (1-2)th alignment signal line. The (1-1)th alignment signal line and the (1-2)th alignment signal line may be physically separated based on the open portion, and the (1-1)th alignment signal line may be directly connected to the alignment pad.

The (1-1)th alignment signal line may be directly connected to the alignment pad through a contact hole passing through the gate insulating layer.

The display device may further comprise a third conductive layer including a second alignment signal line overlapping the first alignment signal line in a plan view on the second conductive layer and electrically connected to the first alignment signal line.

The first substrate portion may further include a passivation layer disposed between an interlayer dielectric layer and the third conductive layer, and a planarization layer disposed between the passivation layer and the third conductive layer.

The second alignment signal line in a plan view may include a (2-1)th alignment signal line and a (2-2)th alignment signal line. The (2-1)th alignment signal line and the (2-2)th alignment signal line may be physically separated based on the open portion, and the (2-2)th alignment signal line may be extended from the non-display area to the display area.

The (2-2)th alignment signal line may be directly connected to the (1-2)th alignment signal line through a contact hole passing through the planarization layer, the passivation layer and the interlayer dielectric layer.

The (1-1)th alignment signal line may overlap the (2-1)th alignment signal line in a plan view, and the (1-2)th alignment signal line overlaps the (2-2)th alignment signal line in a plan view.

The third conductive layer may further include a first electrode disposed on the first bank of the display area and a second electrode disposed on the first bank of the display area and spaced apart from the first electrode. The first electrode and the second electrode may cover the first bank, and the first substrate portion may further include a light emitting element disposed between the first electrode and the second electrode.

A side of the (1-1)th alignment signal line, a side of the (1-2)th alignment signal line, a side of the interlayer dielectric layer, a side of the passivation layer, a side of the planarization layer, a side of the (2-1)th alignment signal line, and a side of the (2-2)th alignment signal line are respectively exposed from the open portion.

The display area may include a light emission area, and a non-light emission area adjacent to the light emission area. The first substrate portion may further include a wavelength converter disposed in the light emission area on the light emitting element, a light blocking member disposed in the non-light emission area and the non-display area, and a capping layer disposed on the wavelength converter and the light blocking member.

A side of the light blocking member may be exposed from the open portion. The capping layer may be directly in contact with the side of the (1-1)th alignment signal line, the side of the (1-2)th alignment signal line, the side of the interlayer dielectric layer, the side of the passivation layer, the side of the planarization layer, the side of the (2-1)th alignment signal line, the side of the (2-2)th alignment signal, which are exposed from the open portion, and the side of the light blocking member.

According to an embodiment of the disclosure, a display device comprises a first substrate portion, in which a display area and a non-display area positioned near the display area, and including a pad area, a first sub-substrate portion, a thin film transistor layer including a plurality of transistors on the first sub-substrate portion, and a plurality of light emitting elements disposed in the display area on the first sub-substrate portion and electrically connected to the plurality of transistors of the thin film transistor layer, and a second substrate portion facing the first substrate portion, and including color filters. The first substrate portion includes an overlap area overlapping the second substrate portion in a plan view, and a protrusion area that protrudes more than a side of the second substrate portion. The thin film transistor layer of the first substrate portion includes: a first conductive layer including an alignment pad disposed in the pad area on the protrusion area of the first sub-substrate portion, and a second conductive layer including a first alignment signal line electrically connected to the alignment pad on the first conductive layer. The protrusion area includes an open portion. The first alignment signal line in a plan view includes a (1-1)th alignment signal line and a (1-2)th alignment signal line physically separated from the (1-1)th alignment signal line based on the open portion.

The thin film transistor layer may further include a semiconductor layer disposed between the first sub-substrate portion and the first conductive layer and disposed in the display area, a gate insulating layer between the semiconductor layer and the first conductive layer, and a gate electrode included in the first conductive layer of the first substrate portion and overlapping the semiconductor layer in a plan view.

The (1-1)th alignment signal line may be directly connected to the alignment pad through a contact hole passing through the gate insulating layer.

The thin film transistor layer may further include a third conductive layer including a second alignment signal line overlapping the first alignment signal line in a plan view on the second conductive layer, and the second alignment signal line may be electrically connected to the first alignment signal line.

The thin film transistor layer may further include a passivation layer disposed between the interlayer dielectric layer and the third conductive layer, and a planarization layer disposed between the passivation layer and the third conductive layer.

The second alignment signal line in a plan view may include a (2-1)th alignment signal line and a (2-2)th alignment signal line physically separated from the (2-1)th alignment signal line based on the open portion. The (2-2)th alignment signal line may be extended from the non-display area to the display area.

Details of other embodiments are included in the detailed description and drawings.

In the display device according to one embodiment, moisture permeation through a first alignment signal line on a protrusion area of a first substrate portion may be prevented.

The effects according to the embodiments of the disclosure are not limited to those mentioned above and more various effects are included in the following description of the disclosure.

BRIEF DESCRIPTION OF THE DRAWINGS

An additional appreciation according to the embodiments of the disclosure will become more apparent by describing in detail embodiments thereof with reference to the accompanying drawings, wherein.

DETAILED DESCRIPTION OF THE EMBODIMENTS

Figure 1:
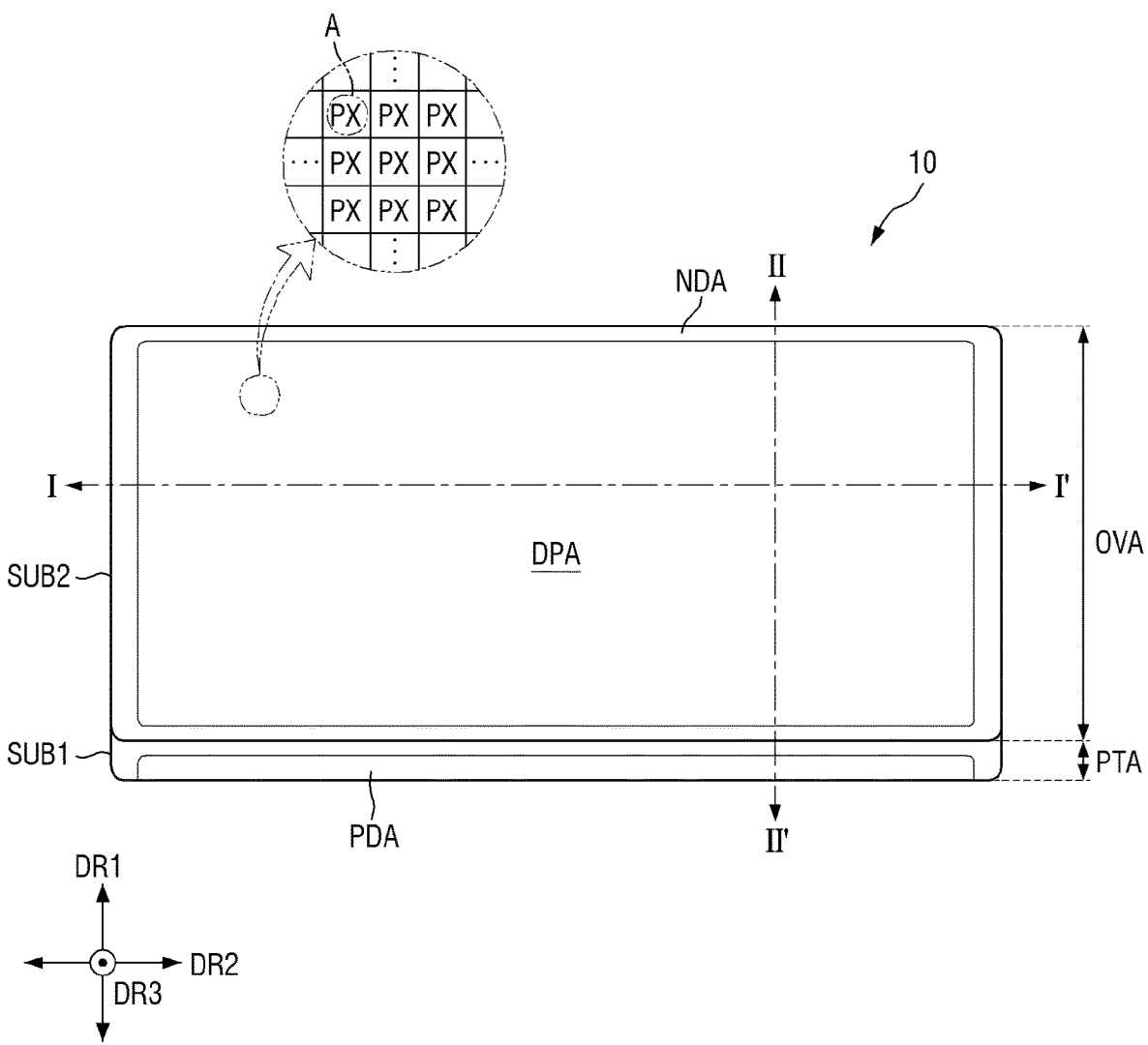
FIG. 1 is a schematic plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various types of elements, these elements should not be limited by these terms. These terms are only used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments are described with reference to the accompanying drawings.

FIG. 1 is a schematic plan view illustrating a display device according to an embodiment.

Referring to FIG. 1, a display device 10 may display a moving image or a still image. The display device 10 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder, etc., which provide a display screen, may be included in the display device 10.

The display device 10 may include a display panel for providing a display screen. Examples of the display panel may include an inorganic light emitting diode display panel, an organic light emitting display panel, a quantum dot light emitting display panel, a plasma display panel, a field emission display panel, or the like. Hereinafter, for convenience of explanation, description of the inorganic light emitting diode display panel applied to the display panel is provided below, but is not limited thereto. Other display panels may be used when the same technical spirits are applicable thereto.

Various modifications may be made in a shape of the display device 10. For example, the display device 10 may have a rectangular shape that is longer in a horizontal direction, a rectangular shape that is longer in a vertical direction, a square shape, a rectangular shape with rounded corners (or vertexes), other polygonal shapes, a circular shape, etc. A shape of a display area DPA of the display device 10 may be also similar to the overall shape of the display device 10. The display device 10 of a rectangular shape that is longer in a second direction DR2 is illustrated in FIG. 1.

The display device 10 may include a display area DPA and a non-display area NDA. The display area DPA may be an area in which an image may be displayed, and the non-display area NDA may be an area in which an image is not displayed. The display area DPA may be referred to as an active area, and the non-display area NDA may be referred to as a non-active area. The display area DPA may generally occupy a center of the display device 10.

The display area DPA may include pixels PX. The pixels PX may be arranged in a matrix direction (or in a matrix arrangement). A shape of each pixel PX may be a rectangular or square shape in a plan view, but is not limited thereto. The shape of each pixel PX may be a rhombus shape in which each side is inclined with respect to a direction. The respective pixels PX may be alternately arranged in a stripe type or an island type. Also, each of the pixels PX may include one or more light emitting elements for emitting light of a wavelength range (e.g., a specific or selectable wavelength range) to display a color (e.g., a specific or selectable color).

The non-display area NDA may be disposed in the vicinity of (or adjacent to) the display area DPA. The non-display area NDA may be adjacent to (e.g., fully or partially surround) the display area DPA. The display area DPA may be rectangular in shape, and the non-display area NDA may be adjacent to four sides of the display area DPA. The non-display area NDA may constitute a bezel of the display device 10. Lines or circuit drivers included in the display device 10 may be disposed in the non-display areas NDA, or external devices may be packaged therein.

As shown in FIG. 1, the display device 10 may include a first substrate portion SUB1 and a second substrate portion SUB2 on the first substrate portion SUB1. The second substrate portion SUB2 may face the first substrate portion SUB1. The first substrate portion SUB1 may include an overlap area OVA and a protrusion area PTA. The first substrate portion SUB1 may overlap the second substrate portion SUB2 in the overlap area OVA in a plan view. The protrusion area PTA may protrude more than a side of the second substrate portion SUB2. For example, the protrusion area PTA may be protruded from a long side edge positioned at another side of the second substrate portion SUB2 in a first direction DR1 in a plan view. The overlap area OVA may include the entire display area DPA. The protrusion area PTA may include a pad area PDA of the non-display area NDA. The pad area PDA may be disposed in the non-display area NDA disposed at the long side edge positioned at the another side of the display area DPA in the first direction DR1, but is not limited thereto.

Figure 2:
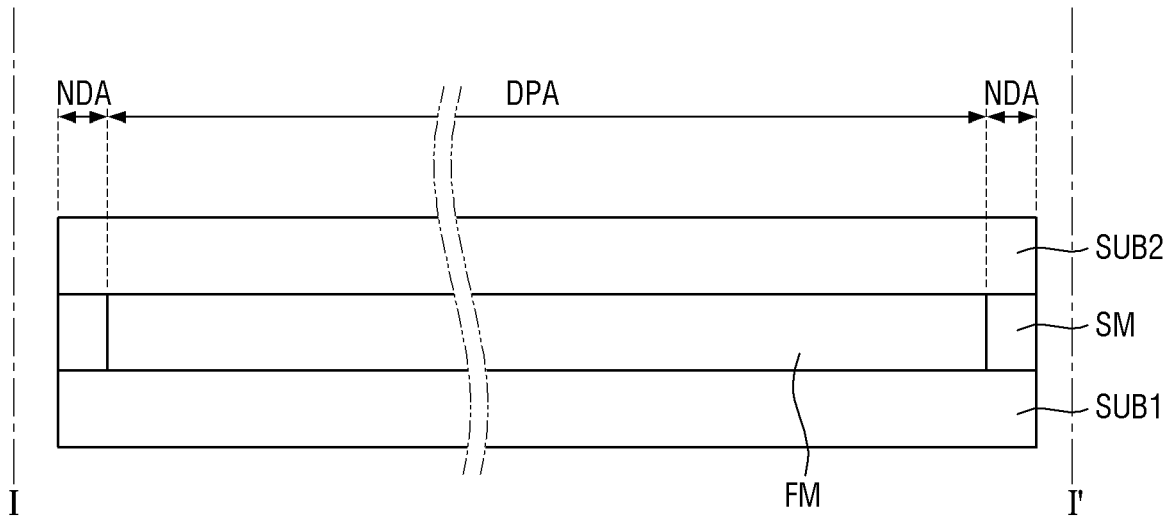
FIG. 2 is a schematic cross-sectional view taken along line I-I' of FIG. 1.
Figure 3:
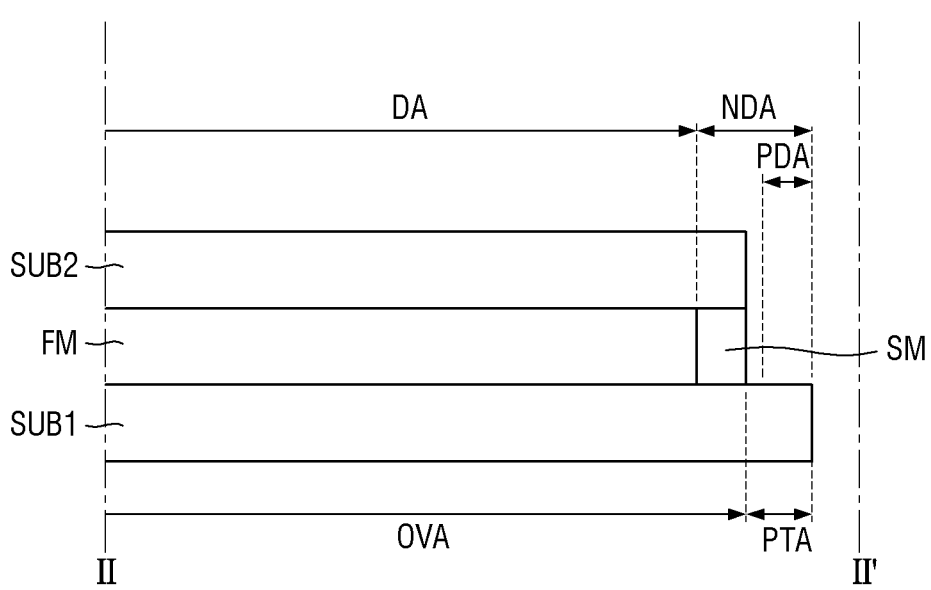
FIG. 3 is a schematic cross-sectional view taken along line II-IF of FIG. 1.

FIG. 2 is a schematic cross-sectional view taken along line I-I' of FIG. 1. FIG. 3 is a schematic cross-sectional view taken along line II-IF of FIG. 1.

Referring to FIGS. 2 and 3, the display device 10 may further include a sealing member SM and a filling member FM. The filling member FM may be disposed in the display area DPA of the overlap area OVA. The filling member FM may be disposed between the first substrate portion SUB1 and the second substrate portion SUB2. In some embodiments, the filling member FM may be made of a material capable of transmitting light. In some embodiments, the filling member FM may be made of an organic material. The filling member FM may be made of a Si-based organic material, an epoxy-based organic material, or the like, but is not limited thereto. In other embodiment, the filling member FM may be omitted.

For example, the first substrate portion SUB1 may be a display substrate or a transistor substrate, and the second substrate portion SUB2 may be a color filter substrate.

The sealing member SM may be disposed between the first substrate portion SUB1 and the second substrate portion SUB2 in the non-display area NDA. The sealing member SM may be disposed along edges of the first substrate portion SUB1 and the second substrate portion SUB2 in the non-display area NDA and may be adjacent to (e.g., surround) the display area DPA in a plan view. The first substrate portion SUB1 and the second substrate portion SUB2 may be coupled to each other by means of the sealing member SM.

In some embodiments, the sealing member SM may be made of an organic material. The sealing member SM may be formed of an epoxy resin, but is not limited thereto.

Figure 4:
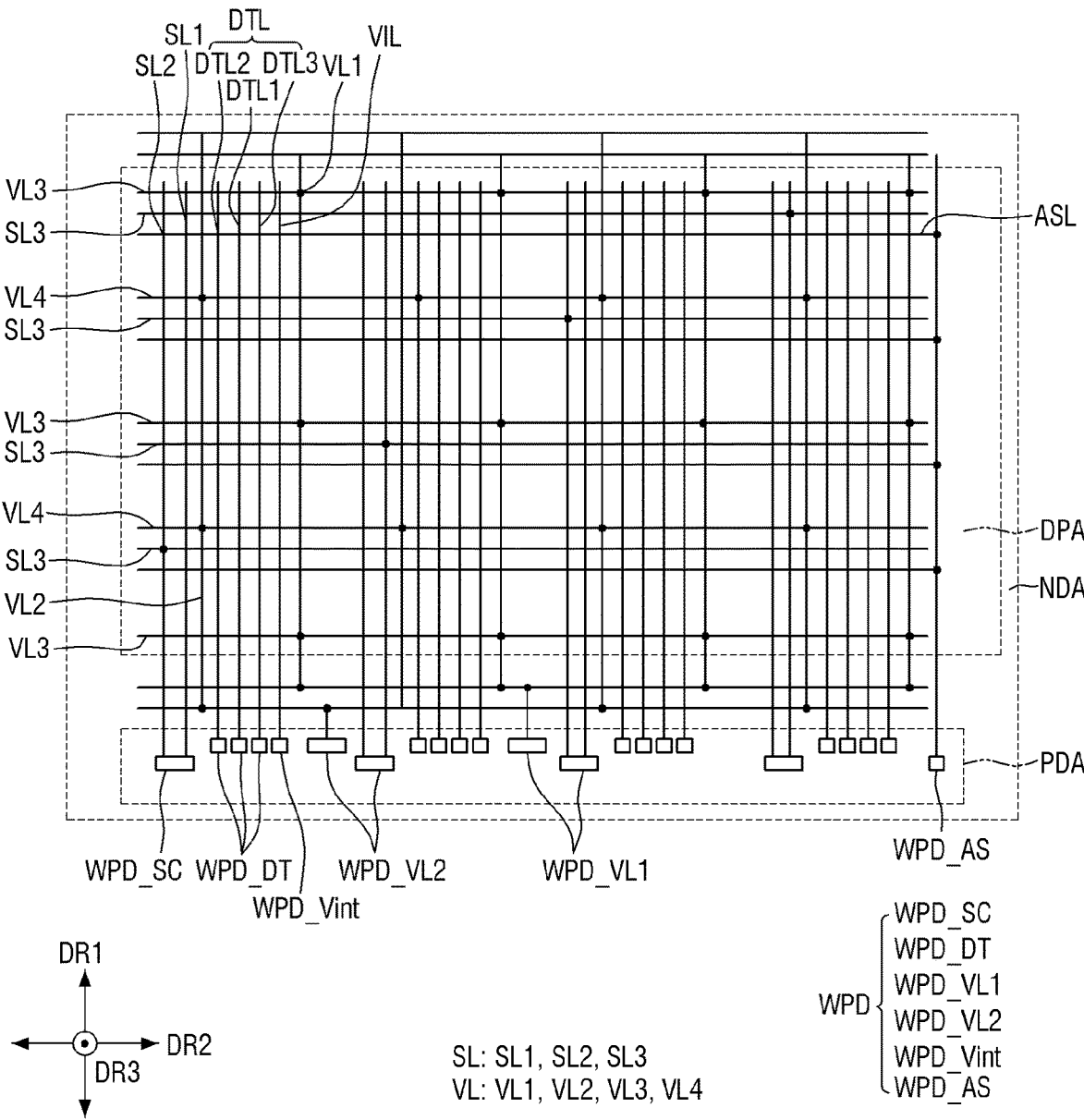
FIG. 4 is a schematic plan view illustrating arrangement of lines of a display device according to an embodiment.

FIG. 4 is a schematic layout view illustrating lines of a display device according to an embodiment.

Referring to FIG. 4, the display device 10 may include lines. The lines may be included in the first substrate portion SUB1 of the display device 10. The display device 10 may include scan lines SL (e.g., first to third scan lines SL1, SL2 and SL3, data lines DTL (e.g., first to third data lines DTL1, DTL2 and DTL3), an initialization voltage line VIL, voltage lines VL (e.g., first to fourth voltage lines VL1, VL2, VL3 and VL4), and alignment signal lines ASL. Also, although not shown in the drawings, the display device 10 may further include other lines, but an extension direction of each of the lines is not limited thereto.

The first scan line SL1, the second scan line SL2, and the alignment signal lines ASL may be extended in the first direction DR1. The first scan line SL1 and the second scan line SL2 may be adjacent to each other, and may be spaced apart from another first scan line SL1 and another second scan line SL2 in the second direction DR2. The first scan line SL1 and the second scan line SL2 may be electrically connected to a scan line pad WPD_SC electrically connected to a scan driver (not shown). The first scan line SL1 and the second scan line SL2 may be extended from the pad area PDA disposed in the non-display area NDA to the display area DPA.

The third scan line SL3 may be extended in the second direction DR2, and may be spaced apart from another third scan line SL3 in the first direction DR1. Each third scan line SL3 may be electrically connected to one or more first scan lines SL1 or one or more second scan lines SL2. The scan lines SL may have a mesh structure on a front surface of the display area DPA, but is not limited thereto.

The alignment signal line ASL may further include a portion extended in the second direction DR2. A portion extended in the second direction DR2 of the alignment signal line ASL may be electrically connected to a pad WPD_AS on the pad area PDA of the non-display area NDA.

The meaning of "connection" herein may include connection of any one member to another member through a third member as well as through a mutual physical (or electrical) contact. Further, it may be understood that a portion and the other portion are interconnected as an integrated member. Furthermore, the connection of any one member to another member may be interpreted in terms of including electrical connection through other member in addition to direct contact connection.

The data lines DTL (e.g., kth and (k+1)th data lines DTLk and DTKk+1) may be extended in the first direction DR1. The data line DTL may include a first data line DTL1, a second data line DTL2, and a third data line DTL3. The first to third data lines DTL1, DTL2 and DTL3 may be disposed in a pair and adjacent to each other. For example, each first data line DTL1, each second data line DTL2, and each third data line DTL3 may be grouped to form the pair. Each of the data lines DTL1, DTL2, and DTL3 may be extended from the pad area PDA disposed in the non-display area NDA to the display area DPA, but the disclosure is not limited thereto. The data lines DTL may be spaced at equal intervals (or constant intervals) between the first voltage line VL1 and the second voltage line VL2. Detailed description of the first voltage line VL1 and the second voltage line VL2 is provided below.

The initialization voltage line VIL may be extended in the first direction DR1. The initialization voltage line VIL may be disposed between the data lines DTL and the first voltage line VL1. The initialization voltage line VIL may be extended from the pad area PDA disposed in the non-display area NDA to the display area DPA.

The first voltage line VL1 and the second voltage line VL2 may be extended in the first direction DR1, and the third voltage line VL3 and the fourth voltage line VL4 may be extended in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be extended in the first direction DR1 and intersect (or cross) the display area DPA. Some lines of the third voltage line VL3 and the fourth voltage line VL4 may be disposed in the display area DPA, and other lines may be disposed in the non-display area NDA positioned on sides of the display area DPA (e.g., both sides) in the first direction DR1. The second voltage line VL2 may be electrically connected to at least one fourth voltage line VL4. The voltage lines VL may have a mesh structure on the front surface of the display area DPA, but is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In an embodiment, each line pad WPD may be disposed in the pad area PDA positioned at a lower side that is another side of the pad area PDA in the first direction DR1. The first scan line SL1 and the second scan line SL2 may be electrically connected to the scan line pad WPD_SC disposed in the pad area PDA. The data lines DTL may be electrically connected to different data line pads WPD_DT, respectively. The initialization voltage line VIL may be electrically connected to an initialization line pad WPD_Vint. The first voltage line VL1 may be electrically connected to a first voltage line pad WPD_VL1. The second voltage line VL2 may be electrically connected to a second voltage line pad WPD_VL2. An external device may be packaged on the line pad WPD. The external device may be packaged on the line pad WPD through an anisotropic conductive film, an ultrasonic bonding, or the like. Each line pad WPD may be disposed in the pad area PDA disposed below the display area DPA, but is not limited thereto. Some of the line pads WPD may be disposed on an upper side or in any one area of left and right sides of the display area DPA.

Each pixel PX (or subpixel SPXn, n is an integer of 1 to 3) of the display device 10 may include a pixel driving circuit. The above-described lines may apply a driving signal to each pixel driving circuit and pass through each pixel PX or a periphery of each pixel PX. The pixel driving circuit may include a transistor and a capacitor. Various modifications may be made in the number of transistors and capacitors of each pixel driving circuit. According to an embodiment, each subpixel SPXn of the display device 10 may have a 3T1C structure in which the pixel driving circuit includes three transistors and a capacitor. Hereinafter, for convenience of explanation, the pixel driving circuit is described based on the 3T1C structure as an example, but other various modified structures such as a 2T1C structure, a 7T1C structure, a 6T1C structure, or the like may be applied thereto.

Figure 5:
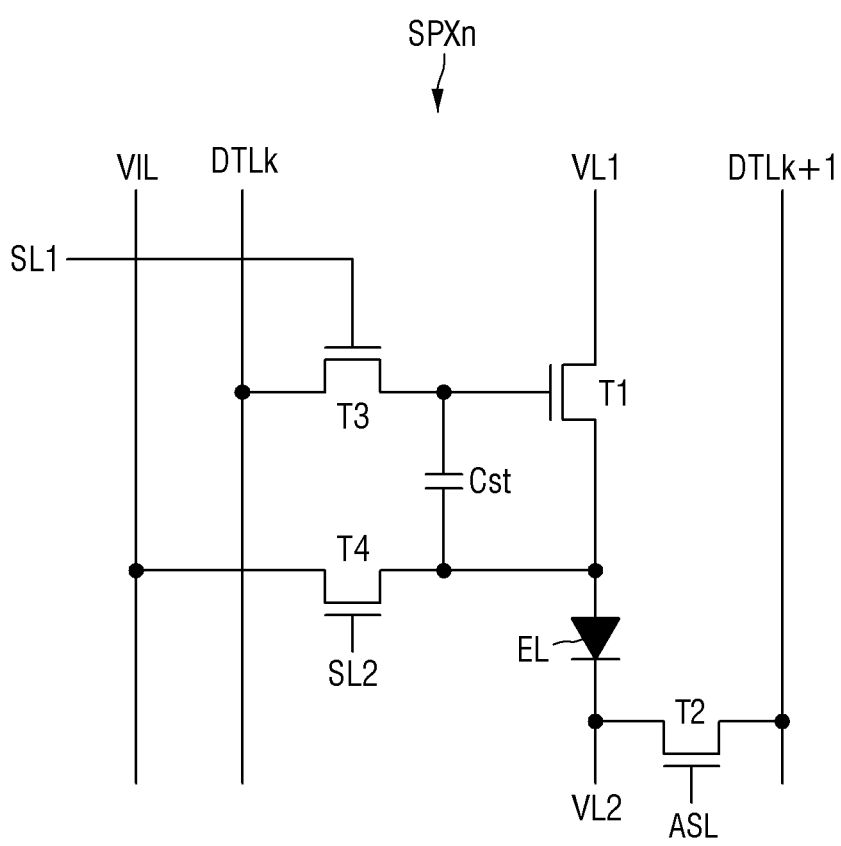
FIGS. 5 and 6 are schematic diagrams of equivalent circuits illustrating a pixel of a display device according to an embodiment.
Figure 6:
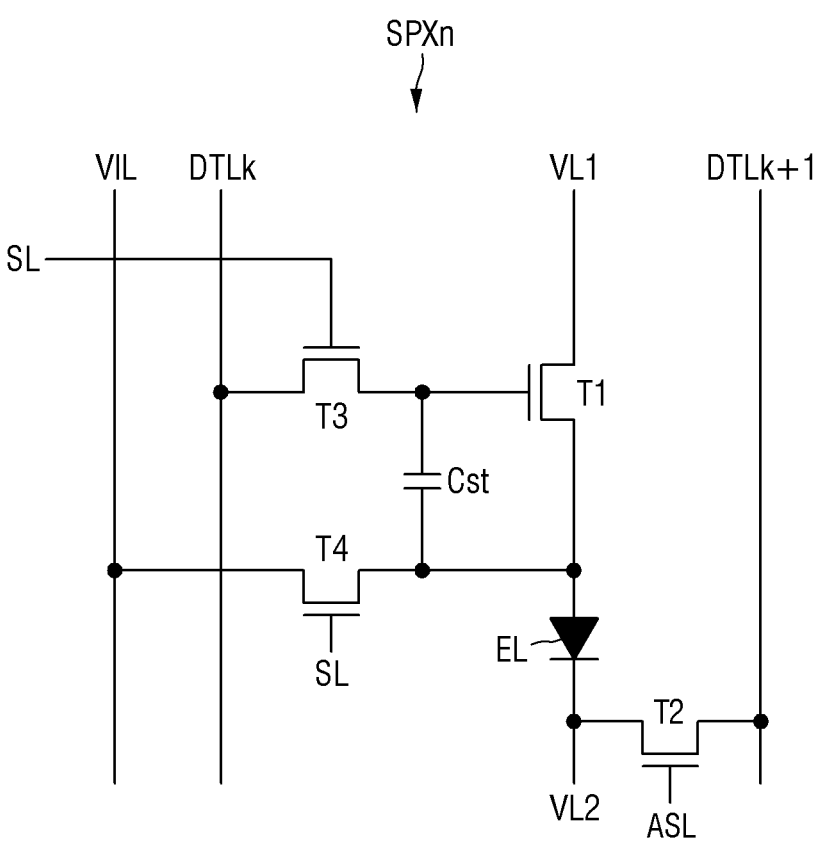

FIGS. 5 and 6 are schematic diagrams of equivalent circuits illustrating a pixel of a display device according to an embodiment.

Referring to FIG. 5, each subpixel SPXn of the display device 10 according to an embodiment may include three transistors T1, T2 and T3, a storage capacitor Cst, and a light emitting diode EL.

The light emitting diode EL may emit light in accordance with a current supplied through the first transistor T1. The light emitting diode EL may include a first electrode, a second electrode, and at least one light emitting element disposed between the first electrode and the second electrode. The light emitting element may emit light of a wavelength range (e.g., a specific or selectable wavelength range) by an electrical signal transferred from the first electrode and the second electrode.

An end of the light emitting diode EL may be electrically connected to a source electrode of the first transistor T1, and another end thereof may be electrically connected to the second voltage line VL2 supplied with a low potential voltage (hereinafter, second power voltage) lower than a high potential voltage (hereinafter, first power voltage) of the first voltage line VL1.

The first transistor T1 may adjust the current flowing from the first voltage line VL1, to which the first power voltage is supplied, to the light emitting diode EL in accordance with a voltage difference between a gate electrode and the source electrode thereof. For example, the first transistor T1 may be a driving transistor for driving the light emitting diode EL. The gate electrode of the first transistor T1 may be electrically connected to a source electrode of the first transistor T2, a source electrode of the first transistor T1 may be electrically connected to the first electrode of the light emitting diode EL, and a drain electrode of the first transistor T1 may be electrically connected to the first voltage line VL1 to which the first power voltage is applied.

The second transistor T2 may be turned on by a signal of the alignment signal line ASL and transfer a voltage applied to the data lines DTL (e.g., kth and (k+1)th data lines DTLk and DTLk+1) to the second electrode of the light emitting diode EL. A gate electrode of the second transistor T2 may be electrically connected to the alignment signal line ASL, a source electrode of the second transistor T2 may be electrically connected to the second electrode of the light emitting diode EL, and a drain electrode of the second transistor T2 may be electrically connected to a (k+1)th data line DTLk+1 (where k is an integer greater than or equal to 1) of another timing of the corresponding subpixel PXn.

The third transistor T3 may be turned on by a scan signal of the first scan line SL1 and electrically connect the data line DTL to the gate electrode of the first transistor T1. A gate electrode of the third transistor T3 may be electrically connected to the first scan line SL1, a source electrode of the third transistor T3 may be electrically connected to the gate electrode of the first transistor T1, and a drain electrode of the third transistor T3 may be electrically connected to the data line DTL.

The fourth transistor T4 may be turned on by a scan signal of the second scan line SL2 and electrically connect the initialization voltage line VIL to the end of the light emitting diode EL. A gate electrode of the fourth transistor T4 may be electrically connected to the second scan line SL2, a drain electrode of the fourth transistor T4 may be electrically connected to the initialization voltage line VIL, and a source electrode of the fourth transistor T4 may be electrically connected to the end of the light emitting diode EL or the source electrode of the first transistor T1.

In an embodiment, the source electrode and the drain electrode of each of the transistors T1, T2, T3 and T4 are not limited to those described above, and may be vice versa. Each of the transistors T1, T2, T3 and T4 may be formed of a thin film transistor. In FIG. 5, each of the transistors T1, T2, T3 and T4 is formed of an N-type metal oxide semiconductor field effect transistor (MOSFET), but is not limited thereto. Each of the transistors T1, T2, T3 and T4 may be formed of a P-type MOSFET. In other embodiments, a portion of the transistors T1, T2, T3 and T4 may be an N-type MOSFET, and another portion thereof may be formed of a P-type MOSFET.

The storage capacitor Cst may be formed between the gate electrode and the source electrode of the first transistor T1. The storage capacitor Cst may store a differential voltage (or voltage difference) between a gate voltage and a source voltage of the first transistor T1.

In the embodiment of FIG. 5, the gate electrode of the third transistor T3 may be electrically connected to the first scan line SL1, and the gate electrode of the fourth transistor T4 may be electrically connected to the second scan line SL2. The first scan line SL1 and the second scan line SL2 may be the scan lines different from each other, and the third transistor T3 and the fourth transistor T4 may be turned on by the scan signals applied from the different scan lines SL1 and SL2, but the disclosure is not limited thereto.

Referring to FIG. 6, the gate electrodes of the third transistor T3 and the fourth transistor T4 may be electrically connected to a same scan line SL. The third transistor T3 and the fourth transistor T4 may be simultaneously turned on by a scan signal applied from the same scan line SL.

Hereinafter, a structure of a pixel PX of the display device 10 according to an embodiment is described in detail with reference to other drawings.

Figure 7:
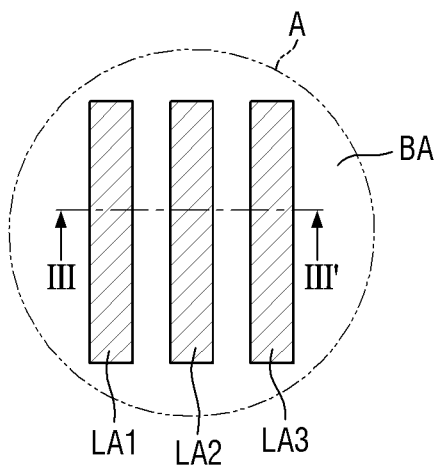
FIG. 7 is a schematic enlarged plan view illustrating an area A of FIG. 1.
Figure 8:
FIG. 8 is a schematic cross-sectional view taken along line of FIG. 7.

FIG. 7 is schematic enlarged plan view illustrating an area A of FIG. 1. FIG. 8 is a schematic cross-sectional view taken along line of FIG. 7.

Referring to FIGS. 7 and 8, each pixel PX of the display device 10 may include light emission areas LA1, LA2 and LA3 defined by a pixel defining layer, and may emit light having a peak wavelength (e.g., a predetermined or selectable peak wavelength) through the light emission areas LA1, LA2 and LA3. For example, the display area DPA of the display device 10 may include a first light emission area LA1, a second light emission area LA2, and a third light emission area LA3. Each of the first to third light emission areas LA1, LA2 and LA3 may be an area where the light generated by the light emitting element of the display device 10 is emitted to the outside of the display device 10.

The first to third light emission areas LA1, LA2 and LA3 may emit the light having the peak wavelength (e.g., the predetermined or selectable peak wavelength) to the outside of the display device 10. The first light emission area LA1 may emit light of a first color, the second light emission area LA2 may emit light of a second color, and the third light emission area LA3 may emit light of a third color. For example, the light of the first color may be red light having a peak wavelength in the range of about 610 nm to about 650 nm, the second color light may be green light having a peak wavelength in the range of about 510 nm to about 550 nm, and the light of the third color may be blue light having a peak wavelength in the range of about 440 nm to about 480 nm, but the disclosure is not limited thereto.

The display area DPA of the display device 10 may include a light blocking area (or light shielding area) BA positioned between adjacent light emission areas LA1, LA2 and LA3. For example, the light blocking area BA between the light emission areas may be adjacent to (e.g., surround) the first light emission area LA1 to the third light emission area LA3.

Referring to FIG. 8, the display device 10 may include the first and second substrate portions SUB1 and SUB2 and the filling member FM. The first and second substrate portions SUB1 and SUB2 may be disposed over the display area DPA and the non-display area NDA. The first substrate portion SUB1 may include a first sub-substrate portion SUB11 and a display element layer on the first sub-substrate portion SUB11. The second substrate portion SUB2 may include a second sub-substrate portion SUB21 and a color filter layer on the second sub-substrate portion SUB21.

The first and second sub-substrate portions SUB11 and SUB21 may be made of an insulating material such as a polymer resin. The insulating material of the first and second sub-substrate portions SUB11 and SUB21 may include, for example, a polyimide PI, but is not limited thereto. The first sub-substrate portion SUB11 and the second sub-substrate portion SUB21 may include a same material.

The display element layer may include a buffer layer BF, a thin film transistor layer TFTL, a light emitting element layer EML, a second planarization layer OC2, a first capping layer CAP1, a first light blocking member BK1, a first wavelength converter WLC1, a second wavelength converter WLC2, a light-transmissive part LTU, and a second capping layer CAP2.

The buffer layer BF may be disposed on the first sub-substrate portion SUB11. The buffer layer BF may be formed of an inorganic layer capable of preventing permeation of air or moisture.

The thin film transistor layer TFTL may include a thin film transistor TFT, a gate insulating layer GI, an interlayer dielectric layer ILD, a first passivation layer PAS1, and a first planarization layer OC1.

The thin film transistor TFT may be disposed on the buffer layer BF, and may constitute a pixel circuit of each of the pixels PX.

The thin film transistor TFT may include a semiconductor layer ACT, a gate electrode GE, a source electrode SE, and a drain electrode DE. The semiconductor layer ACT may be provided on the buffer layer BF. The semiconductor layer ACT may overlap the gate electrode GE, the source electrode SE, and the drain electrode DE in a plan view. The semiconductor layer ACT may be in direct contact with the source electrode SE and the drain electrode DE, and may face the gate electrode GE with the gate insulating layer GI interposed therebetween in a plan view.

Although not shown, the display element layer may further include a first conductive layer disposed between the buffer layer BF and the first sub-substrate portion SUB11. The first conductive layer may include a light blocking conductive pattern that overlaps the semiconductor layer ACT in a plan view. The first conductive layer may further include an alignment pad WPD_AS (e.g., refer to FIG. 12). Detailed description of the alignment pad WPD_AS is provided below.

A second conductive layer may be disposed on the gate insulating layer GI. The second conductive layer may include the gate electrode GE, and the gate electrode GE may overlap the semiconductor layer ACT in a plan view. The gate insulating layer GI may be interposed between the gate electrode GE and the semiconductor layer ACT. The interlayer dielectric layer ILD may be disposed on the second conductive layer. The second conductive layer may further include a first alignment signal line ASLL1 (e.g., refer to FIG. 12). Detailed description of the first alignment signal line ASLL1 is provided below.

A third conductive layer may be disposed on the interlayer dielectric layer ILD. The third conductive layer may include the source electrode SE and the drain electrode DE. The source electrode SE and the drain electrode DE may be spaced apart from each other on the interlayer dielectric layer ILD. The source electrode SE may be in contact with an end of the semiconductor layer ACT through a contact hole provided in (or passing through) the gate insulating layer GI and the interlayer dielectric layer ILD. The drain electrode DE may be in contact with another end of the semiconductor layer ACT through the contact hole provided in (or passing through) the gate insulating layer GI and the interlayer dielectric layer ILD. The drain electrode DE may be electrically connected to a first electrode AE of a light emitting member EL through a contact hole provided in (or passing through) the first passivation layer PAS1 and the first planarization layer OC1.

The gate insulating layer GI may be provided on the semiconductor layer ACT. For example, the gate insulating layer GI may be disposed on the semiconductor layer ACT and the buffer layer BF, and may electrically insulate the semiconductor layer ACT from the gate electrode GE. The gate insulating layer GI may include a contact hole through which the source electrode SE passes and a contact hole through which the drain electrode DE passes.

The interlayer dielectric layer ILD may be disposed on the gate electrode GE. For example, the interlayer dielectric layer ILD may include a contact hole through which the source electrode SE passes and a contact hole through which the drain electrode DE passes.

The first passivation layer PAS1 may be provided on the thin film transistor TFT and protect the thin film transistor TFT. For example, the first passivation layer PAS1 may include a contact hole through which the first electrode AE passes.

The first planarization layer OC1 may be provided on the first passivation layer PAS1 and planarize an upper end (or upper surface) of the thin film transistor TFT. For example, the first planarization layer OC1 may include a contact hole through which the first electrode AE of the light emitting member EL passes.

The light emitting element layer EML may include the light emitting member EL, a first bank BNK1, a second bank BNK2, a first element insulating layer QPAS1, and a second passivation layer PAS2.

The light emitting member EL may be provided on the thin film transistor TFT. The light emitting member EL may include the first electrode AE, a second electrode CE, and a light emitting element ED.

A fourth conductive layer may include the first electrode AE and the second electrode CE. The first electrode AE may be provided on the first planarization layer OC1. For example, the first electrode AE may be disposed on the first bank BNK1 disposed on the first planarization layer OC1 and cover the first bank BNK1. The first electrode AE may overlap one of the first to third light emission areas LA1, LA2 and LA3 in a plan view. The first to third light emission areas LA1, LA2, and LA3 may be defined by the second bank BNK2. The first electrode AE may be electrically connected to the drain electrode DE of the thin film transistor TFT.

The second electrode CE may be formed on the first planarization layer OC1. For example, the second electrode CE may be disposed on the first bank BNK1 disposed on the first planarization layer OC1 and cover the first bank BNK1. The second electrode CE may overlap one of the first to third light emission areas LA1, LA2 and LA3 in a plan view. The first to third light emission areas LA1, LA2, and LA3 may be defined by the second bank BNK2. For example, the second electrode CE may receive a common voltage supplied to the entire pixels PX. The fourth conductive layer may further include a second alignment signal line ASLL2 (e.g., refer to FIG. 13). Detailed description of the second alignment signal line ASLL2 is provided below.

The first element insulating layer QPAS1 may cover a portion of the first electrode AE and a portion of the second electrode CE, which are adjacent to each other, and may electrically insulate the first electrode AE from the second electrode CE.

The light emitting element ED may be disposed between the first electrode AE and the second electrode CE above the first planarization layer OC1. The light emitting element ED may be disposed on the first element insulating layer QPAS1. An end of the light emitting element ED may be electrically connected to the first electrode AE, and another end of thereof may be electrically connected to the second electrode CE. For example, multiple light emitting elements ED may include active layers having a same material and emit light of a same wavelength range or light of a same color. The light emitted from each of the first to third light emission areas LA1, LA2 and LA3 may have the same color. For example, the light emitting elements ED may emit light of a third color or blue light, which has a peak wavelength in the range of about 440 nm to about 480 nm.

The second bank BNK2 may be disposed on the first planarization layer OC1 and define the first to third light emission areas LA1, LA2 and LA3. For example, the second bank BNK2 may be adjacent to (e.g., surround) each of the first to third light emission areas LA1, LA2 and LA3, but is not limited thereto. The second bank BNK2 may be disposed in the light blocking area BA.

The second passivation layer PAS2 may be disposed on the light emitting members EL and the second bank BNK2. The second passivation layer PAS2 may cover the light emitting members EL, and may protect the light emitting members EL.

The second planarization layer OC2 may be provided above the light emitting element layer EML and planarize an upper end (or upper surface) of the light emitting element layer EML. The second planarization layer OC2 may include an organic material.

The first capping layer CAP1 may be disposed on the second planarization layer OC2. The first capping layer CAP1 may seal lower surfaces of the first and second wavelength converters WLC1 and WLC2 and the light-transmissive part LTU. The first capping layer CAP1 may include an inorganic material.

The first light blocking member BK1 may be disposed in the light blocking area BA on the first capping layer CAP1. The first light blocking member BK1 may overlap the second bank BNK2 in a thickness direction. The first light blocking member BK1 may block (or shield) transmission of light.

The first light blocking member BK1 may include an organic light blocking material and a liquid repellent component.

The first light blocking member BK1 may include a liquid repellent component and separate the first and second wavelength converters WLC1 and WLC2 and the light-transmissive part LTU into corresponding light emission areas LA.

The first wavelength converter WLC1 may be disposed in the first light emission area LA1 on the first capping layer CAP1. The first wavelength converter WLC1 may be adjacent to (e.g., be surrounded by) the first light blocking member BK1. The first wavelength converter WLC1 may include a first base resin BS1, a first scatterer SCT1, and a first wavelength shifter WLS1.

The first base resin BS1 may include a material having relatively high light transmittance. The first base resin BS1 may be made of a transparent organic material. For example, the first base resin BS1 may include at least one of organic materials such as an epoxy-based resin, an acrylic resin, a cardo-based resin, and an imide-based resin. However, the embodiments are not limited thereto.

The first scatterer SCT1 may have a refractive index different from that of the first base resin BS1, and may form an optical interface with the first base resin BS1.

The first wavelength shifter WLS1 may convert or shift a peak wavelength of light incident into a first peak wavelength. For example, the first wavelength shifter WLS1 may convert blue light provided by the display device into red light having a single peak wavelength in the range of about 610 nm to about 650 nm and emit the red light. The first wavelength shifter WS1 may be a quantum dot, a quantum rod, or a phosphor. The quantum dot of the first wavelength shifter WS1 may be a granular material that emits light of a color (e.g., a specific or selectable color) and electrons of the granular material may be transited from a conduction band to a valence band.

The light emitted by the first wavelength shifter WLS1 may have a full width of half maximum (FWHM) of about 45 nm or less, or about 40 nm or less, or about 30 nm or less, and color purity and color reproducibility of a color displayed by the display device may be further improved.

A portion of the blue light provided from the light emitting element layer EML may pass through the first wavelength converter WLC1 without being converted into red light by the first wavelength shifter WLS1. Among the blue light provided from the light emitting element layer EML, light that is incident on a first color filter CF1 without being converted by the first wavelength converter WLC1 may be blocked (or shielded) by the first color filter CF1. Among the blue light provided from the display device, the red light converted by the first wavelength converter WLC1 may be emitted to the outside through the first color filter CF1. Therefore, the first light emission area LA1 may emit red light.

The second wavelength converter WLC2 may be disposed in the second light emission area LA2 on the first capping layer CAP1. The second wavelength converter WLC2 may be adjacent to (e.g., be surrounded by) the first light blocking member BK1. The second wavelength converter WLC2 may include a second base resin BS2, a second scatterer SCT2, and a second wavelength shifter WLS2.

The second base resin BS2 may include a material having relatively high light transmittance. The second base resin BS2 may be made of a transparent organic material.

The second scatterer SCT2 may have a refractive index different from that of the second base resin BS2, and may form an optical interface with the second base resin BS2. For example, the second scatterer SCT2 may include a light scattering material or light scattering particles that scatter at least a portion of transmissive light.

The second wavelength shifter WLS2 may convert or shift a peak wavelength of incident light to a second peak wavelength different from the first peak wavelength of the first wavelength shifter WLS1. For example, the second wavelength shifter WLS2 may convert the blue light provided from the display device into green light having a single peak wavelength in the range of about 510 nm to about 550 nm and emit the green light. The second wavelength shifter WLS2 may be a quantum dot, a quantum rod, or a phosphor. The second wavelength shifter WLS2 and the first wavelength shifter WLS1 may include a same material.

The light-transmissive part LTU may be disposed on the third light emission area LA3 on the first capping layer CAP1. The light-transmissive part LTU may be adjacent to (e.g., be surrounded by) the first light blocking member BK1. The light-transmissive part LTU may maintain a peak wavelength of incident light to transmit the incident light. The light-transmissive part LTU may include a third base resin BS3 and a third scatterer SCT3.

The third base resin BS3 may include a material having relatively high light transmittance. The third base resin BS3 may be made of a transparent organic material.

The third scatterer SCT3 may have a refractive index different from that of the third base resin BS3, and may form an optical interface with the third base resin BS3. For example, the third scatterer SCT3 may include a light scattering material or light scattering particles that scatter at least a portion of the transmissive light.

The first and second wavelength converters WLC1 and WLC2 and the light-transmissive part LTU may be disposed on the light emitting element layer EML through the second planarization layer OC2 and the first capping layer CAP1. Thus, the display device may not require a separate substrate for the first and second wavelength converters WLC1 and WLC2 and the light-transmissive part LTU.

The second capping layer CAP2 may cover the first and second wavelength converters WLC1 and WLC2, the light-transmissive part LTU and the first light blocking member BK1.

The second light blocking member BK2 of the second substrate portion SUB2 may be disposed in the light blocking area BA of the second sub-substrate portion SUB21. The second light blocking member BK2 may overlap the first light blocking member BK1 or the second bank BNK2 in the thickness direction. The second light blocking member BK2 may block (or shield) transmission of light.

The first color filter CF1 may be disposed in the first light emission area LA1 on the second sub-substrate portion SUB21. The first color filter CF1 may be adjacent to (e.g., be surrounded by) the second light blocking member BK2. The first color filter CF1 may overlap the first wavelength converter WLC1 in the thickness direction. The first color filter CF1 may selectively transmit light of the first color (e.g., red light) and block (e.g., shield or absorb) light of the second color (e.g., green light) and light of the third color (e.g., blue light).

A second color filter CF2 may be disposed in the second light emission area LA2 on the second sub-substrate portion SUB21. The second color filter CF2 may be adjacent to (e.g., be surrounded by) the second light blocking member BK2. The second color filter CF2 may overlap the second wavelength converter WLC2 in the thickness direction. The second color filter CF2 may selectively transmit light of the second color (e.g., green light) and may block (e.g., shield or absorb) light of the first color (e.g., red light) and light of the third color (e.g., blue light).

A third color filter CF3 may be disposed in the third light emission area LA3 on the second sub-substrate portion SUB21. The third color filter CF3 may be adjacent to (e.g., be surrounded by) the second light blocking member BK2. The third color filter CF3 may overlap the light-transmissive part LTU in the thickness direction. The third color filter CF3 may selectively transmit light of a third color (e.g., blue light) and may block (e.g., shield or absorb) light of the first color (e.g., red light) and light of the second color (e.g., green light).

The first to third color filters CF1, CF2 and CF3 may absorb a portion of light incident from the outside of the display device 10 and reduce reflective light due to external light. Therefore, the first to third color filters CF1, CF2 and CF3 may prevent color distortion due to the external light reflection.

The third passivation layer PAS3 may cover the first to third color filters CF1, CF2 and CF3. The third passivation layer PAS3 may protect the first to third color filters CF1, CF2 and CF3.

The above-described filling member FM may be disposed between the third passivation layer PAS3 and the second capping layer CAP2.

Figure 9:
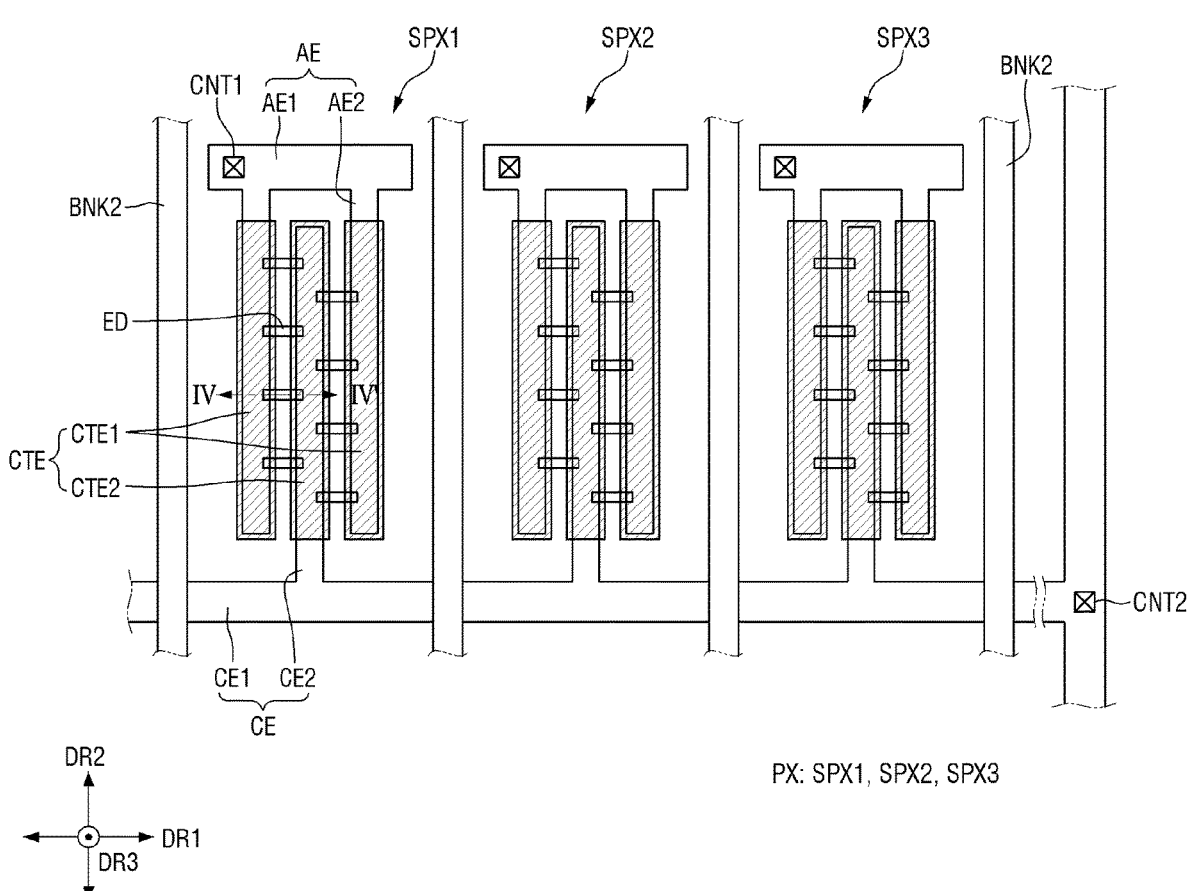
FIG. 9 is a schematic plan view illustrating a pixel of a display device according to an embodiment.
Figure 10:
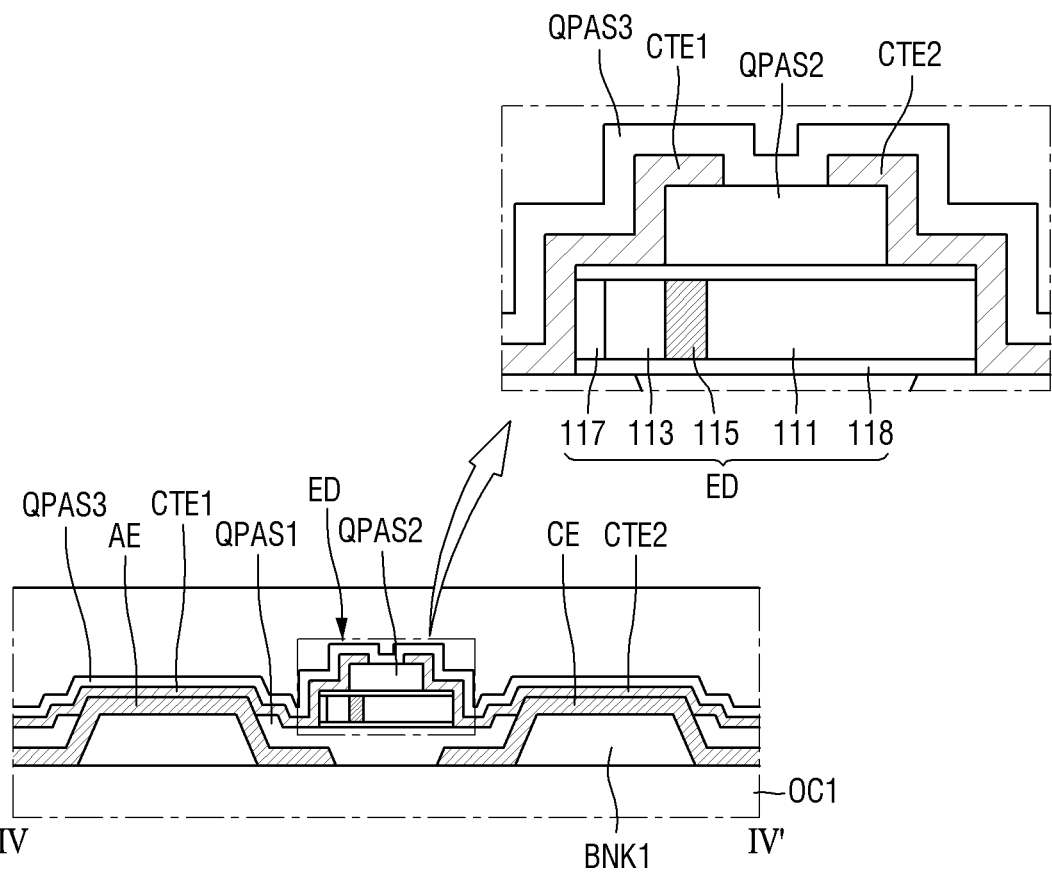
FIG. 10 is a schematic cross-sectional view taken along line IV-IV' of FIG. 9.

FIG. 9 is a schematic plan view illustrating a pixel of a display device according to an embodiment. FIG. 10 is a schematic cross-sectional view taken along line IV-IV' of FIG. 9.

Referring to FIGS. 8 to 10, each of the pixels PX may include a first subpixel SPX1, a second subpixel SPX2, and a third subpixel SPX3. The first to third subpixels SPX1, SPX2, and SPX3 may correspond to the first to third light emission areas LA1, LA2 and LA3, respectively. The light emitting elements ED of the first to third subpixels SPX1, SPX2, and SPX3 may emit light through the first to third light emission areas LA1, LA2 and LA3.

The first to third subpixels SPX1, SPX2, and SPX3 may emit light of a same color. For example, the first to third subpixels SPX1, SPX2, and SPX3 may include a same type of light emitting elements ED, and may emit light of a third color or blue light. For another example, the first subpixel SPX1 may emit light of a first color or red light, and the second subpixel SPX2 may emit light of a second color or green light, and the third subpixel SPX3 may emit light of a third color or blue light.

Each of the first to third subpixels SPX1, SPX2, and SPX3 may include first and second electrodes AE and CE, a light emitting element ED, contact electrodes CTE, and second banks BNK2.

The first and second electrodes AE and CE may be electrically connected to the light emitting element ED and receive a voltage (e.g., a predetermined or selectable voltage), and the light emitting element ED may emit light of a wavelength range (e.g., a specific or selectable wavelength range). At least a portion of the first and second electrodes AE and CE may form an electric field in the pixel PX (or the subpixel SPX1, SPX2, or SPX3), and the light emitting element ED may be aligned by the electric field.

For example, the first electrode AE may be a pixel electrode separated for each of the first to third subpixels SPX1, SPX2, and SPX3, and the second electrode CE may be a common electrode commonly connected to the first to third subpixels SPX1, SPX2, and SPX3. Any one of the first electrode AE and the second electrode CE may be an anode electrode of the light emitting element ED, and another of the first electrode AE and the second electrode CE may be a cathode electrode of the light emitting element ED.

The first electrode AE may include a first electrode stem portion AE1 and at least one first electrode branch portion AE2. The first electrode stem portion AE1 may be extended in the first direction DR1, and the at least one first electrode branch portion AE2 may be diverged from the first electrode stem portion AE1 and extended in the second direction DR2.

The first electrode stem portion AE1 of each of the first to third subpixels SPX1, SPX2, and SPX3 may be spaced apart from another first electrode stem portion AE1 of another subpixel adjacent thereto, and the first electrode stem portion AE1 may be disposed on a virtual extension line with the first electrode stem portion AE1 of the subpixel adjacent thereto in the first direction DR1. The first electrode stem portions AE1 of the first to third subpixels SPX1, SPX2, and SPX3 may receive respective signals different from one another, and may be driven independently.

The first electrode branch portion AE2 may be diverged from the first electrode stem portion AE1 and extended in the second direction DR2. An end of the first electrode branch portion AE2 may be electrically connected to the first electrode stem portion AE1, and another end of the first electrode branch portion AE2 may be spaced apart from a second electrode stem portion CE1 opposing the first electrode stem portion AE1.

The second electrode CE may include the second electrode stem portion CE1 and a second electrode branch portion CE2. The second electrode stem portion CE1 may be extended in the first direction DR1, and the second electrode branch portion CE2 may be diverged from the second electrode stem portion CE1 and extended in the second direction DR2. The second electrode stem portion CE1 of each of the first to third subpixels SPX1, SPX2, and SPX3 may be electrically connected with the second electrode stem portion CE1 of another subpixel adjacent thereto. The second electrode stem portion CE1 may be extended in the first direction DR1, and may intersect (or cross) the pixels PX (or the first to third subpixels SPX1, SPX2, and SPX3). The second electrode stem portions CE1 may be electrically connected with an outer portion of the display area DA or a portion extended from the non-display area NDA in a direction.

The second electrode branch portion CE2 may be spaced apart from the first electrode branch portion AE2, and may oppose (or face) the first electrode branch portion AE2. An end of the second electrode branch portion CE2 may be electrically connected to the second electrode stem portion CE1, and another end of the second electrode branch portion CE2 may be spaced apart from the first electrode stem portion AE1.

The first electrode AE may be electrically connected with the thin film transistor layer TFTL of the display device through a first contact hole CNT1, and the second electrode CE may be electrically connected with the thin film transistor layer TFTL of the display device through a second contact hole CNT2. For example, the first contact hole CNT1 may be disposed in (or pass through) each of the first electrode stem portions AE1, and the second contact hole CNT2 may be disposed in (or pass through) the second electrode stem portions CE1. However, the contact holes CNT1 and CNT2 are not limited thereto. In some embodiments, the light emitting element ED may be disposed and aligned, and the first electrode AE or the second electrode CE may be electrically connected to the above-described alignment pad WPD_AS. In other embodiments, the light emitting element ED may be disposed and aligned, and the first electrode AE or the second electrode CE may be electrically connected to the alignment signal line ASL electrically connected to the alignment pad WPD_AS.

The second bank BNK2 may be disposed in a boundary between the pixels PX. The first electrode stem portions AE1 may be spaced apart from each other based on the second bank BNK2 (or be separated from each other by the second bank BNK2). The second bank BNK2 may be extended in the second direction DR2, and may be disposed in the boundary between pixels PX arranged in the first direction DR1. The second bank BNK2 may be disposed in the boundary between pixels PX arranged in the second direction DR2. The second bank BNK2 may define the boundary of the pixels PX (e.g., the pixels PX arranged in the first direction DR1 and the second direction DR2).

The second bank BNK2 may prevent scattered inks from getting out of the boundary of the pixels PX when the scattered inks, in which the light emitting elements ED are scattered, are sprayed in the process of manufacturing the display device. For example, in case that the inks including the scattered light emitting elements ED are sprayed in the process of manufacturing the display device, the second bank BNK2 may prevent the inks from flowing out of the boundary of the pixels PX. The second bank BNK2 may separate the different light emitting elements ED from each other and the scattered inks, in which the different light emitting elements ED are scattered, may not be mixed with each other.

The light emitting element ED may be disposed between the first electrode AE and the second electrode CE. An end of the light emitting element ED may be electrically connected to the first electrode AE, and another end of the light emitting element ED may be electrically connected to the second electrode CE.

The light emitting elements ED may be spaced apart from each other, and may be substantially aligned in a direction (e.g., in parallel with each other). A spaced interval of the light emitting elements ED may not be limited, and the light emitting elements ED may be spaced apart from each other by various intervals.

The light emitting elements ED may include active layers having a same material and emit light of a same wavelength range or light of a same color. The first to third subpixels SPX1, SPX2, and SPX3 may emit light of the same color. For example, the light emitting elements ED may emit light of the third color or blue light, which has a peak wavelength ranging from about 440 nm to about 480 nm.

The contact electrode CTE may include a first contact electrode CTE1 and a second contact electrode CTE2. The first contact electrode CTE1 may cover a portion of the first electrode branch portion AE2 and the light emitting element ED, and may electrically connect the first electrode branch portion AE2 with the light emitting element ED. The second contact electrode CTE2 may cover another portion of the second electrode branch portion CE2 and the light emitting element ED, and may electrically connect the second electrode branch portion CE2 with the light emitting element ED.

The first contact electrode CTE1 may be disposed on the first electrode branch portion AE2 and extended in the second direction DR2. The first contact electrode CTE1 may be in contact with an end of the light emitting element ED. The light emitting element ED may be electrically connected with the first electrode AE through the first contact electrode CTE1.

The second contact electrode CTE2 may be disposed on the second electrode branch portion CE2 and extended in the second direction DR2. The second contact electrode CTE2 may be spaced apart from the first contact electrode CTE1 in the first direction DR1. The second contact electrode CTE2 may be in contact with another end of the light emitting element ED. The light emitting element ED may be electrically connected with the second electrode CE through the second contact electrode CTE2.

The light emitting element layer EML of the display device may be disposed on the thin film transistor layer TFTL, and may include a first element insulating layer QPAS1, a second element insulating layer QPAS2, and a third element insulating layer QPAS3.

The first banks BNK1 may be disposed in the first to third light emission areas LA1, LA2 and LA3, respectively. Each of the first banks BNK1 may correspond to the first electrode AE or the second electrode CE. Each of the first and second electrodes AE and CE may be disposed on a corresponding first bank BNK1. For example, the first banks BNK1 may be disposed on the first planarization layer OC1, and sides of each of the first banks BNK1 may be inclined from the first planarization layer OC1. The inclined surfaces of the first bank BNK1 may reflect the light emitted from the light emitting element ED.

The first electrode stem portion AE1 may include a first contact hole CNT1 passing through the first planarization layer OC1. The first electrode stem portion AE1 may be electrically connected to the thin film transistor TFT through the first contact hole CNT1.

The second electrode stem portion CE1 may be extended in the first direction DR1, and may be also disposed in the non-light emission area in which the light emitting element ED is not disposed. The second electrode stem portion CE1 may include a second contact hole CNT2 passing through the first planarization layer OC1. The second electrode stem portion CE1 may be electrically connected to a power electrode through the second contact hole CNT2. The second electrode CE may receive an electrical signal (e.g., a predetermined or selectable electrical signal) from the power electrode.

The first and second electrodes AE and CE may include a transparent conductive material. The first and second electrodes AE and CE may include a conductive material having high reflectance. Each of the first and second electrodes AE and CE may have a structure in which a transparent conductive material and a metal having high reflectance are stacked each other and form one or more layers, or may be formed of a single layer that includes a transparent conductive material and a metal having high reflectance.

The first element insulating layer QPAS1 may be disposed on the first planarization layer OC1, the first electrode AE, and the second electrode CE. The first element insulating layer QPAS1 may cover a portion of each of the first and second electrodes AE and CE.

The first element insulating layer QPAS1 may protect the first and second electrodes AE and CE, and may electrically insulate the first and second electrodes AE and CE from each other. The first element insulating layer QPAS1 may prevent the light emitting element ED from being damaged by direct contact with other members.

The light emitting element ED may be disposed between the first electrode AE and the second electrode CE on the first element insulating layer QPAS1. An end of the light emitting element ED may be electrically connected to the first electrode AE, and another end of the light emitting element ED may be electrically connected to the second electrode CE.

The second element insulating layer QPAS2 may be partially disposed on the light emitting element ED disposed between the first and second electrodes AE and CE. The second element insulating layer QPAS2 may be disposed at a central portion of an upper surface of the light emitting element ED. The third insulating layer QPAS3 may be adjacent to (e.g., partially surround) an outer surface of the light emitting element ED. The third insulating layer QPAS3 may protect the light emitting element ED. The third insulating layer QPAS3 may be adjacent to (e.g., surround) the outer surface of the light emitting element ED.

The contact electrode CTE may include first and second contact electrodes CTE1 and CTE2. The first contact electrode CTE1 may cover a portion of the first electrode branch AE2 and the light emitting element ED, and may electrically connect the first electrode branch portion AE2 with the light emitting element ED. The second contact electrode CTE2 may cover another portion of the second electrode branch portion CE2 and the light emitting element ED, and may electrically connect the second electrode branch portion CE2 with the light emitting element ED.

The first contact electrode CTE1 may be disposed on the first electrode branch portion AE2 and extended in the second direction DR2. The first contact electrode CTE1 may be in contact with the end of the light emitting element ED. The light emitting element ED may be electrically connected to the first electrode AE through the first contact electrode CTE1.

The first contact electrode CTE1 may be in contact with (e.g., directly in contact with) an upper surface of an end of the second element insulating layer QPAS2.

The second contact electrode CTE2 may be disposed on the second electrode branch portion CE2 and extended in the second direction DR2. The second contact electrode CTE2 may be spaced apart from the first contact electrode CTE1 in the first direction DR1. The second contact electrode CTE2 may be in contact with the another end of the light emitting element ED. The light emitting element ED may be electrically connected to the second electrode CE through the second contact electrode CTE2.

The second contact electrode CTE2 may be in contact with (e.g., directly in contact with) an upper surface of the another end of the second element insulating layer QPAS2.

The first contact electrode CTE1 and the second contact electrode CTE2 may be disposed on a same layer. Each of the first contact electrode CTE1 and the second contact electrode CTE2 may expose an upper surface of a central portion of the second element insulating layer QPAS2.

Each of the first contact electrode CTE1 and the second contact electrode CTE2 may include a conductive material. The first contact electrode CTE1 may include a first material, and the second contact electrode CTE2 may include a second material. However, the first material of the first contact electrode CTE1 and the second material of the second contact electrode CTE2 may have respective physical properties different from each other. A detailed description of the first material and the second material is provided below.

Figure 11:
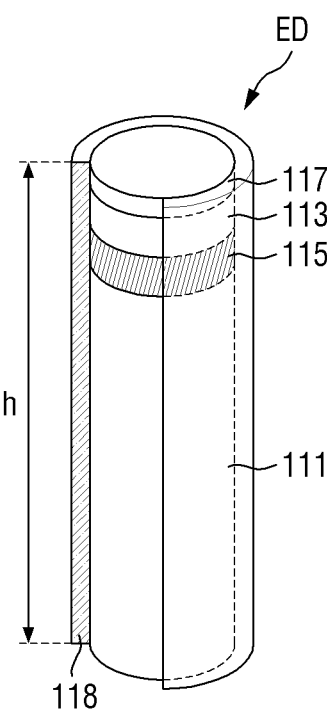
FIG. 11 is a schematic view illustrating a light emitting element according to an embodiment.

FIG. 11 is a schematic view illustrating a light emitting element according to an embodiment.

Referring to FIG. 11, the light emitting element ED may be a light emitting diode. For example, the light emitting element 300 may be an inorganic light emitting diode made of an inorganic material with a size of a micro-meter scale to a nano-meter scale. The inorganic light emitting diode may be aligned between two electrodes (e.g., the first and second electrodes AE and CE) facing each other in accordance with an electric field formed in a direction (e.g., a specific or selectable direction) between the two electrodes.

The light emitting element ED may have a shape extended in a direction. The light emitting element ED may have a shape such as a rod, a wire, a tube, or the like. The light emitting element ED may include a first semiconductor layer 111, a second semiconductor layer 113, an active layer 115, an electrode layer 117, and an insulating layer 118.

The first semiconductor layer 111 may be an n-type semiconductor. The second semiconductor layer 113 may be disposed on the active layer 115. Each of the first and second semiconductor layers 111 and 113 may be comprised of a layer, but is not limited thereto.

The active layer 115 may be disposed between the first and second semiconductor layers 111 and 113. The active layer 115 may include a material of a single or multiple quantum well structure. In case that the active layer 115 includes a material of the multiple quantum well structure, quantum layers and well layers may be alternately stacked each other.

The light emitted from the active layer 115 may be emitted in a longitudinal direction of the light emitting element ED, and may be also emitted to the sides (e.g., both sides) of the light emitting element ED. The light may be emitted from the active layer 115 of the light emitting element ED in various directions.

The electrode layer 117 may be an ohmic contact electrode. For another example, the electrode layer 117 may be a Schottky contact electrode. The light emitting element ED may include at least one electrode layer 117.

The insulating layer 118 may be adjacent to (e.g., surround) outer surfaces of the semiconductor layers 111, 113, and 115 and the electrode layer 117. The insulating layer 118 may be adjacent to (e.g., surround) an outer surface of the active layer 115, and may be extended in a direction in which the light emitting element ED is extended. The insulating layer 118 may protect the light emitting element ED.

The insulating layer 118 may include materials having insulation property. For example, the insulating layer 118 may include at least one of silicon oxide ($SiO_x$), silicon nitride ($SiN_x$), silicon oxynitride ($SiO_xN_y$), aluminum nitride (AlN), aluminum oxide ($Al_2O_3$), etc. However, the disclosure is not limited thereto.

An outer surface of the insulating layer 118 may be surface-treated. The light emitting element ED dispersed in an ink (e.g., a predetermined or selectable ink) may be sprayed onto the electrode and sprayed during the manufacturing of the display device. Thus, the light emitting element ED may be aligned.

Figure 12:
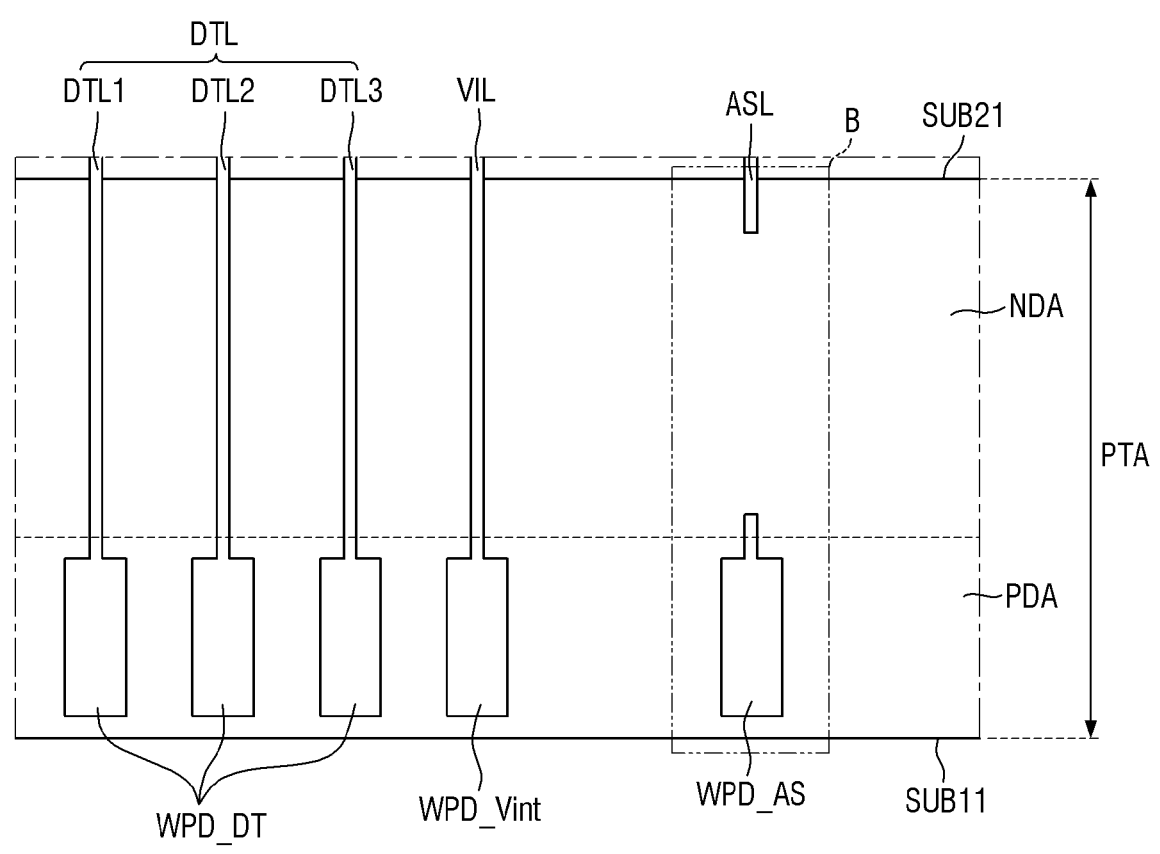
FIG. 12 is a schematic enlarged plan view illustrating a protrusion that includes a pad area of FIG. 1.
Figure 12:
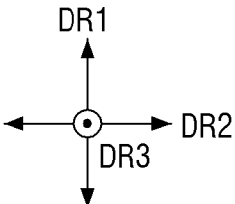
Figure 13:
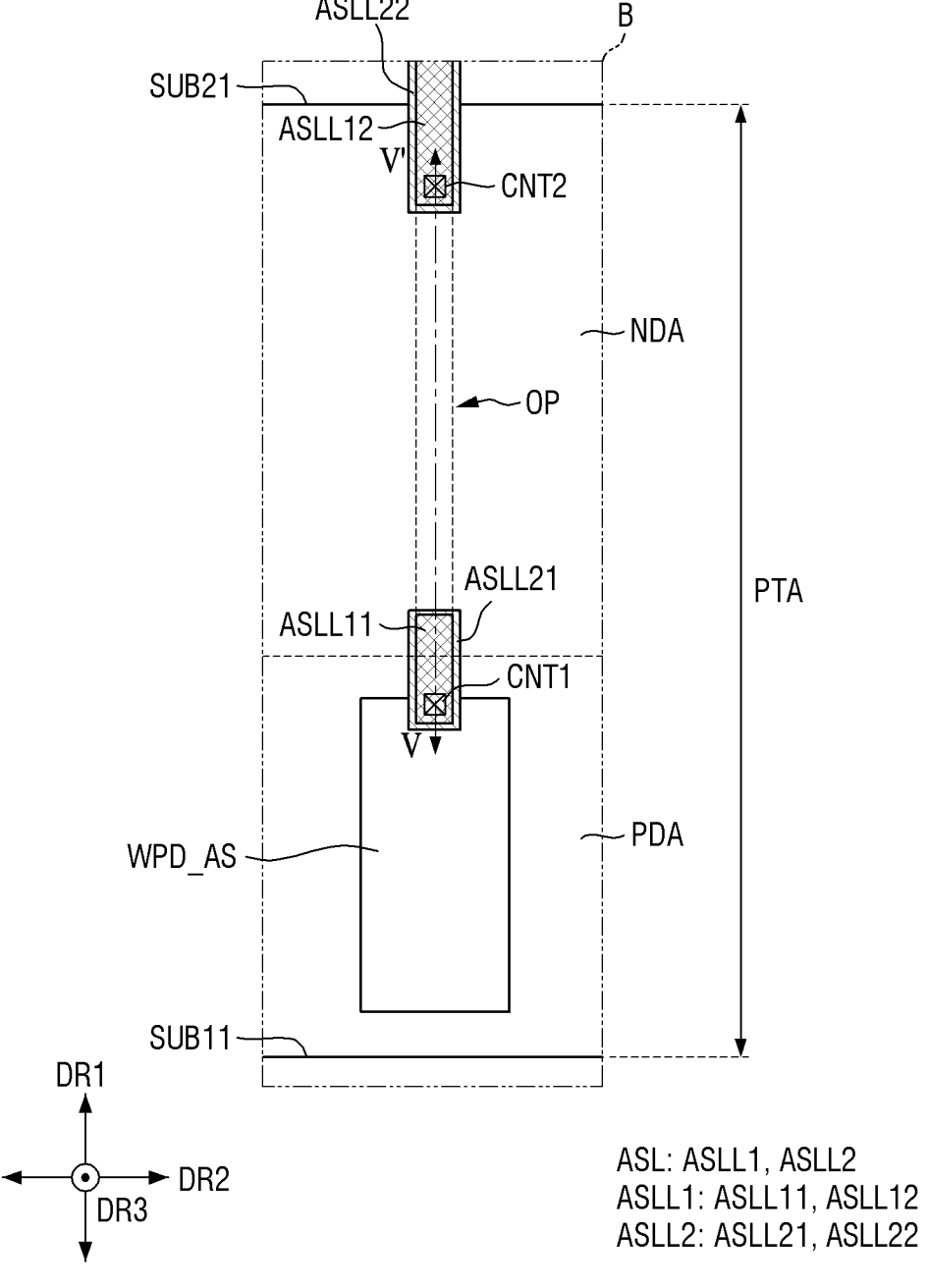
FIG. 13 is a schematic enlarged plan view illustrating an area B of FIG. 12.
Figure 14:
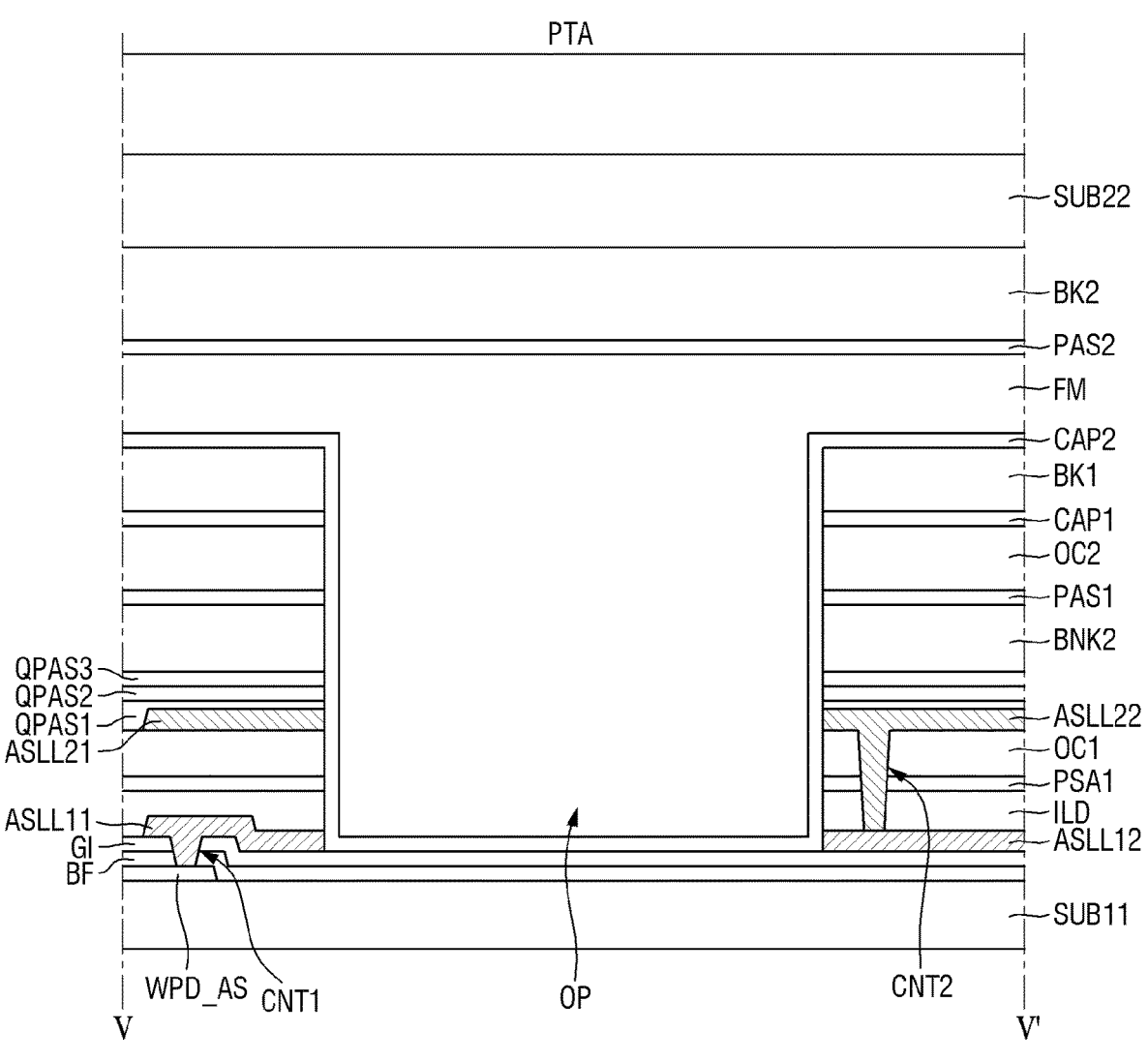
FIG. 14 is a schematic cross-sectional view taken along line V-V' of FIG. 13.

FIG. 12 is a schematic enlarged plan view illustrating a protrusion that includes a pad area of FIG. 1. FIG. 13 is a schematic enlarged plan view illustrating an area B of FIG. 12. FIG. 14 is a schematic cross-sectional view taken along line V-V' of FIG. 13.

Referring to FIGS. 12 to 14, the alignment signal line ASL may include a first alignment signal line ASLL1 and a second alignment signal line ASLL2 overlapping the first alignment signal line ASLL1 in a plan view. The first alignment signal line ASLL1 and the second alignment signal line ASLL2 may be disconnected by an open portion OP. The open portion OP may be defined within the protrusion area PTA. The first alignment signal line ASLL1 may be physically separated into a (1-1)th alignment signal line (or 1-1-th alignment signal line) ASLL11 and a (1-2)th alignment signal line ASLL12 based on the open portion OP (or by the open portion OP). The second alignment signal line ASLL2 may be physically separated into a (2-1)th alignment signal line ASLL21 and a (2-2)th alignment signal line ASLL22 based on the open portion OP (or by the open portion OP). The (1-1)th alignment signal line ASLL11 and the (2-1)th alignment signal line ASLL21 may overlap each other in the thickness direction. The (2-1)th alignment signal line ASLL21 and the (2-2)th alignment signal line ASLL22 may overlap each other in the thickness direction.

The (1-1)th alignment signal line ASLL11 may be electrically connected to the alignment pad WPD_AS through the first contact hole CNT1. The first contact hole CNT1 may pass through the gate insulating layer GI and the buffer layer BF. The (2-2) alignment signal line ASLL22 may be electrically connected to the (1-2)th alignment signal line ASLL12 through the second contact hole CNT2. The second contact hole CNT2 may pass through the first planarization layer OC1, the first passivation layer PAS1, and the interlayer dielectric layer ILD.

According to an embodiment, each of the first alignment signal line ASLL1 and the second alignment signal line ASLL2 may have a line structure disconnected by the open portion OP defined in the protrusion area PTA, whereby moisture may be more readily prevented from moving to the display area DPA through the first alignment signal line ASLL1.

Further, in case of the display device 10 according to an embodiment, each of the first alignment signal line ASLL1 and the second alignment signal line ASLL2 may have a line structure disconnected by the open portion OP defined in the protrusion PTA, and the exposed sides of the first alignment signal line ASLL1 and the second alignment signal line ASLL2 may be covered by a separate capping layer. Thus, external moisture from the (1-1)th alignment signal line ASLL11 may be blocked by the capping layer and fail to enter the open portion OP, and moisture permeation into the display area DPA may be more readily avoided.

In more detail, the open portion OP may be defined above the gate insulating layer GI. Thus, the interlayer dielectric layer ILD, the first planarization layer OC1, the element insulating layers QPAS1, QPAS2 and QPAS3, the second bank BNK2, the first passivation layer PAS1, the second planarization layer OC2, the first capping layer CAP1, the first light blocking member BK1, the first alignment signal line ASLL1, and the second alignment signal line ASLL2 may pass through the open portion OP in the thickness direction. As a result, sides of the interlayer dielectric layer ILD, the first planarization layer OC1, the element insulating layers QPAS1, QPAS2 and QPAS3, the second bank BNK2, the first passivation layer PAS1, the second planarization layer OC2, the first capping layer CAP1, and the first light blocking member BK1 may be also exposed from the open portion OP.

The second capping layer CAP2 may be in contact with (e.g., directly in contact with) the exposed sides of the interlayer dielectric layer ILD, the first planarization layer OC1, the element insulating layers QPAS1, QPAS2 and QPAS3, the second bank BNK2, the first passivation layer PAS1, the second planarization layer OC2, the first capping layer CAP1, and the first light blocking member BK1, a side of the (1-1)th alignment signal line ASLL11, a side of the (1-2)th alignment signal line ASLL12, a side of the (2-1)th alignment signal line ASLL21, and a side of the (2-2)th alignment signal line ASLL22.

The filling member FM may be disposed on the second capping layer CAP2 and fill the open portion OP.

The (1-1)th alignment signal line ASLL11 and the (1-2)th alignment signal line ASLL12 of a first alignment signal line layer of the second conductive layer may be formed in the process of forming the first light blocking member BK1 in a first light blocking member layer. An area (e.g., a portion of the first light blocking member layer) corresponding to the light emission areas LA1, LA2 and LA3 and an area (e.g., a portion of the first light blocking member layer) corresponding to the corresponding open portion OP may be removed from the first light blocking member layer, and the first light blocking member BK1 may be formed. The process of removing the area corresponding to the light emission areas LA1, LA2 and LA3 and the area corresponding to the corresponding open portion OP from the first light blocking member layer may be performed through a wet etching process. An etchant used for the wet etching process may be potassium hydroxide (KOH), but is not limited thereto. A portion of the first alignment signal line layer disposed in the open portion OP may also be removed in the process of removing the area corresponding to the light emission areas LA1, LA2 and LA3 and the area corresponding to the corresponding open portion OP from the first light blocking member layer. The (1-1)th alignment signal line ASLL11 and the (1-2)th alignment signal line ASLL12 may be separated from the open portion OP and formed.

As described above, according to an embodiment, each of the first alignment signal line ASLL1 and the second alignment signal line ASLL2 may be disconnected by the open portion OP defined in the protrusion are PTA. Thus, moisture may be prevented from moving to the display area DPA through the first alignment signal line ASLL1. For example, moisture transfer through the first alignment signal line ASLL1 may be prevented in the display area DPA.

Further, each of the first alignment signal line ASLL1 and the second alignment signal line ASLL2 may be disconnected by the open portion OP defined in the protrusion are PTA, and the exposed sides of the first alignment signal line ASLL1 and the second alignment signal line ASLL2 may be covered by the second capping layer CAP2. Thus, moisture permeation of the first wavelength converters WCL1 and WCL2 and the light-transmissive part LTU may be prevented, and external moisture from the (1-1)th alignment signal line ALSLL11 toward the open portion OP may be blocked by the second capping layer CAP2. Therefore, moisture permeation into the display area DPA may be avoided (or prevented) more readily.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a first substrate portion including:
a display area; and
a non-display area positioned near the display area, and including a pad area; and
a second substrate portion facing the first substrate portion, wherein
the first substrate portion further includes:
an overlap area overlapping the second substrate portion in a plan view;
a protrusion area that protrudes more than a side of the second substrate portion;
a first sub-substrate portion;
a first conductive layer including an alignment pad disposed in the pad area on the protrusion area of the first sub-substrate portion; and
a second conductive layer including a first alignment signal line electrically connected to the alignment pad on the first conductive layer,
the protrusion area includes an open portion, and
the first alignment signal line in a plan view is physically separated based on the open portion.

2. The display device of claim 1, wherein the first substrate portion further includes a semiconductor layer disposed between the first sub-substrate portion and the first conductive layer and disposed in the display area.

3. The display device of claim 2, wherein the first substrate portion further includes:
a gate insulating layer between the semiconductor layer and the first conductive layer; and
a gate electrode included in the first conductive layer of the first substrate portion and overlapping the semiconductor layer in a plan view.

4. The display device of claim 3, wherein
the first alignment signal line in a plan view includes:
a 1-1-th alignment signal line; and
a 1-2-th alignment signal line,
the 1-1-th alignment signal line and the 1-2-th alignment signal line are physically separated based on the open portion, and
the 1-1-th alignment signal line is directly connected to the alignment pad.

5. The display device of claim 4, wherein the 1-1-th alignment signal line is directly connected to the alignment pad through a contact hole passing through the gate insulating layer.

6. The display device of claim 4, further comprising:
a third conductive layer including a second alignment signal line overlapping the first alignment signal line in a plan view on the second conductive layer, and electrically connected to the first alignment signal line.

7. The display device of claim 6, wherein the first substrate portion further includes:
a passivation layer disposed between an interlayer dielectric layer and the third conductive layer; and
a planarization layer disposed between the passivation layer and the third conductive layer.

8. The display device of claim 7, wherein
the second alignment signal line in a plan view includes:
a 2-1-th alignment signal line; and
a 2-2-th alignment signal line,
the 2-1-th alignment signal line and the 2-2-th alignment signal line are physically separated based on the open portion, and
the 2-2-th alignment signal line is extended from the non-display area to the display area.

9. The display device of claim 8, wherein the 2-2-th alignment signal line is directly connected to the 1-2-th alignment signal line through a contact hole passing through the planarization layer, the passivation layer, and the interlayer dielectric layer.

10. The display device of claim 8, wherein
the 1-1-th alignment signal line overlaps the 2-1-th alignment signal line in a plan view, and
the 1-2-th alignment signal line overlaps the 2-2-th alignment signal line in a plan view.

11. The display device of claim 8, wherein
the third conductive layer further includes:
a first electrode disposed on a first bank of the display area; and
a second electrode disposed on the first bank of the display area and spaced apart from the first electrode,
the first electrode and the second electrode cover the first bank, and
the first substrate portion further includes a light emitting element disposed between the first electrode and the second electrode.

12. The display device of claim 11, wherein a side of the 1-1-th alignment signal line, a side of the 1-2-th alignment signal line, a side of the interlayer dielectric layer, a side of the passivation layer, a side of the planarization layer, a side of the 2-1-th alignment signal line, and a side of the 2-2-th alignment signal line are respectively exposed from the open portion.

13. The display device of claim 12, wherein
the display area includes:
a light emission area; and
a non-light emission area adjacent to the light emission area, and
the first substrate portion further includes:
a wavelength converter disposed in the light emission area on the light emitting element;
a light blocking member disposed in the non-light emission area and the non-display area; and
a capping layer disposed on the wavelength converter and the light blocking member.

14. The display device of claim 13, wherein
a side of the light blocking member is exposed from the open portion, and the capping layer is directly in contact with the side of the 1-1-th alignment signal line, the side of the 1-2-th alignment signal line, the side of the interlayer dielectric layer, the side of the passivation layer, the side of the planarization layer, the side of the 2-1-th alignment signal line, the side of the 2-2-th alignment signal line, which are exposed from the open portion, and the side of the light blocking member.

15. A display device comprising:

a first substrate portion including:

a display area; and a non-display area positioned near the display area, and including a pad area;

a first sub-substrate portion;

a thin film transistor layer including a plurality of transistors on the first sub-substrate portion; and a plurality of light emitting elements disposed in the display area on the first sub-substrate portion and electrically connected to the plurality of transistors of the thin film transistor layer; and a second substrate portion facing the first substrate portion, and including color filters, wherein the first substrate portion further includes:

an overlap area overlapping the second substrate portion in a plan view; and a protrusion area that protrudes more than a side of the second substrate portion, the thin film transistor layer of the first substrate portion includes:

a first conductive layer including an alignment pad disposed in the pad area on the protrusion area of the first sub-substrate portion; and a second conductive layer including a first alignment signal line electrically connected to the alignment pad on the first conductive layer, the protrusion area includes an open portion, and the first alignment signal line in a plan view includes:

a 1-1-th alignment signal line; and a 1-2-th alignment signal line physically separated from the 1-1-th alignment signal line based on the open portion.

16. The display device of claim 15, wherein the thin film transistor layer further includes:

a semiconductor layer disposed between the first sub-substrate portion and the first conductive layer and disposed in the display area;

a gate insulating layer between the semiconductor layer and the first conductive layer; and a gate electrode included in the first conductive layer of the first substrate portion and overlapping the semiconductor layer in a plan view.

17. The display device of claim 16, wherein the 1-1-th alignment signal line is directly connected to the alignment pad, and the 1-1-th alignment signal line is directly connected to the alignment pad through a contact hole passing through the gate insulating layer.

18. The display device of claim 17, wherein the thin film transistor layer further includes a third conductive layer including a second alignment signal line overlapping the first alignment signal line in a plan view on the second conductive layer, and the second alignment signal line is electrically connected to the first alignment signal line.

19. The display device of claim 18, wherein the thin film transistor layer further includes:

a passivation layer disposed between an interlayer dielectric layer and the third conductive layer; and a planarization layer disposed between the passivation layer and the third conductive layer.

20. The display device of claim 19, wherein the second alignment signal line in a plan view includes:

a 2-1-th alignment signal line; and a 2-2-th alignment signal line physically separated from the 2-1-th alignment signal line based on the open portion, and the 2-2-th alignment signal line is extended from the non-display area to the display area.

* * * * *